United States Patent
Bae

(10) Patent No.: US 7,236,293 B2
(45) Date of Patent: Jun. 26, 2007

(54) FREQUENCY CONVERTER USING OPTICAL EXCITATION SURFACE PLASMA AND ITS METHOD

(75) Inventor: Jongsuck Bae, Kasugai (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 10/544,847

(22) PCT Filed: Feb. 9, 2004

(86) PCT No.: PCT/JP2004/001327

§ 371 (c)(1),
(2), (4) Date: Feb. 13, 2006

(87) PCT Pub. No.: WO2004/070939

PCT Pub. Date: Aug. 19, 2004

(65) Prior Publication Data

US 2006/0161608 A1    Jul. 20, 2006

(30) Foreign Application Priority Data

Feb. 10, 2003    (JP)    ............................. 2003-032779

(51) Int. Cl.
G02F 1/365    (2006.01)
G02F 2/02    (2006.01)
(52) U.S. Cl. .................... 359/326; 359/331; 333/218
(58) Field of Classification Search ........ 359/326–332; 333/218
See application file for complete search history.

(56) References Cited

U.S. PATENT DOCUMENTS 3,590,267 A * 6/1971 Patel ......................... 359/327
5,323,024 A * 6/1994 Adams ........................ 257/80
5,428,226 A * 6/1995 Adams ........................ 257/80

FOREIGN PATENT DOCUMENTS

JP    03-186822 A    8/1991
JP    10-206918 A    8/1998

OTHER PUBLICATIONS

Shoseki Hai, Koji Mizuno, "Hikari Reiki Handotai Plasma O Mochiita Doppler Shift-gata Shihasu Hensu", The Institute of Electronics, Information and Communication Engineers Gijursu Kenkyu Hokoku, vol. 103, No. 234, Jul. 24, 2003 pp. 1 to 6.

(Continued)

Primary Examiner—Michelle Connelly-Cushwa
(74) Attorney, Agent, or Firm—Lowe Hauptman & Berner, LLP

(57) ABSTRACT

A frequency converter having no solid-state devices having nonlinear characteristics and no complex resonator structure and operable in a wide frequency range from microwave frequencies to terahertz wave frequencies. An input section (1) inputs an input wave into a high-frequency transmission line (2). A waveguide portion of an output section (6) reflects the input wave. A laser light source (4) inputs a laser beam into an optical delay circuit (5). The optical delay circuit (5) delays the laser beam and directs the delayed laser beam into a high-frequency transmission line (2) and a substrate (3). The laser beam transmitted through the optical delay circuit (5) produces an electron-hole plasma over the surface of the substrate (3) such as of a semiconductor thereby to short-circuit the high-frequency transmission line (2) and to reflect the input wave. The reflection point moves at high speed together with the laser beam, thereby converting the frequency on the same principle as the Doppler effect. The output section (6) total-reflects the input wave and takes out only an output wave.

11 Claims, 9 Drawing Sheets

OTHER PUBLICATIONS

Shoseki Hai, Koji Mizuno, "Hikari Reiki Handotai Plasma O Mochiita Shuhasu Up Converter", 2003 Nen the Institute of Electronics, Information and Communicaiton Engineers, Sogo Taikai Koen Ronbunshu Electronics 1, Mar. 3, 2003 p. 344.

M. Lampe, E. Ott, W.M. Manheimer, and S. Kainer, "Submillimeter-Wave Production by Upshifted Reflection from a Moving Ionization Front", IEEE Transactions on Microwave Theory and Techniques, pp. 556 to 558, vol. MTT-25, No. 6, Jun. 1977.

Martin Lampe and Edward Ott, "Interaction of electromagnetic waves with a moving ionization front" The Physics of Fluids, Void 21, No. 1 Jan. 1978, pp. 42 to 54.

Noboru Yugami, Toshihiko Niiyama, Takeshi Higashiguchi, Hong Gau, Shigeo Sasak, Hiroaki Ito and Ysushi Nishida "Experimental observation of short-pulse upshifted frequency microwaves from a laser-created overdense plasma" Physical Review E. Part 2B, vol. 65, No. 3, Mar. 2002, pp. 036505-1-036505-5.

D. Hashimshony and A. Zigler, Conversion of Electrostatic to Electromagnetic waves by superluminous Ionization Fronts Physical Review Letter, vol. 86, No. 13, Mar. 26, 2001 pp. 2806 to 2809.

Hiroshi Ito, Kiyoshi Soda, "Kosoku Ido Kyokai ni yoru Denjiha no Doppler Shuhasu Sen'I" Oyo Butsuri, vol. 48, No. 7, Jul. 10, 1979 pp. 616 to 622.

Igor Scherbatko, "Double-Doppler wavelength conversion of infrared optical pulses by moving grating of refractive index in semi conductors" Optical and Quantum Electronics, vol. 31 No. 9/10, Oct. 1999, pp. 965 to 979.

"Doppler Up-Shift of Frequency Using Optically Generated Plasma in Semiconductor Transmission Lines" Bae Jongsuck and Koji Mizuno, Research Institute of Electrical Communication, Tohoku University Jul. 2003.

"High Power radiation from ionization fronts in a static electric field in a waveguide" J.R. Hoffman et al, Journal of Applied Physics, vol. 90, No. 3; Aug. 1, 2001, pp. 1115-1123.

"Wave Interactions with Moving Boundaries" C.S. Tsai and B. A. Auld, Journal of Applied Physics, vol. 38, No. 5 Apr. 1967, pp. 2106-2115.

200, 400 and 800 GHZ Schottky Diode "Substrateless" Multipliers: Design and Results E.SChlecht et al, 2001 IEEE, 4 pp.

"Fabrication and Performance of InP-Based Heterostructure Barrier Varactors in a 250-GHz Waveguide Tripler" Xavier Mélique et al, IEEE Transaction on Microwave theory and technique, vol. 48, No. 6, Jun. 2000, pp. 1000-1006.

"Simulation of Terahertz Doppler Wavelength Shifting of Infrared Optical Pulses in an Active Semiconductor Layer", Igor V. Scherbatko et al, IEEE Transactions on Microwave Theory and Techniques, vol. 48, No. 4, Apr. 4, 2000, pp. 725-732.

* cited by examiner

FREQUENCY CONVERTER USING OPTICAL EXCITATION SURFACE PLASMA AND ITS METHOD

CROSS-REFERENCE TO RELATED APPLICATIONS

The present Application is based on International Application No. PCT/JP2004/001327, filed on Feb. 9, 2004, which in turn corresponds to JP 2003-32779 filed on Feb. 10, 2003, and priority is hereby claimed under 35 USC 119 based on these applications. Each of these applications are hereby incorporated by reference in their entirety into the present application.

TECHNICAL FIELD

The present invention relates to a frequency converter using an optical excitation surface plasma and its method, and relates to a frequency converter and its method in which an electromagnetic wave is reflected by a free carrier (plasma) induced by an optical pulse moving at high speed on a semiconductor surface, and a frequency is converted (multiplied) based on a phase change of the reflected electromagnetic wave.

BACKGROUND OF THE INVENTION

Conventionally, as a method of increasing/converting the frequency of an input wave in an electromagnetic wave region of a frequency of 1 THz or less, there has been used a method in which electric nonlinearity of a semiconductor element such as a varactor diode or various transistors is used, and the element is incorporated in a resonator to perform multiplication (see non-patent documents 1 and 2).

Besides, conventionally, non-patent document 3 discloses a theoretical analysis of reflected and transmitted waves in the case where the boundary surface of a stationary plasma moves at high speed. Non-patent document 4 discloses a theoretical analysis of reflected and transmitted waves in the case where only the boundary surface of a stationary dielectric moves at high speed. Non-patent document 5 discloses the Doppler frequency transition of an electromagnetic field moving at high speed to generate a frequency change by the Doppler effect, in which a variable-capacitance diode is mounted to a coaxial cable, a voltage pulse is made to travel to generate an equivalent moving boundary surface, and a change in transmission frequency of an incident wave is measured. Non-patent document 6 discloses an experiment to examine that in a line loaded with a capacitor charged at high voltage, discharge is performed by a laser beam as a trigger to generate an equivalent plasma boundary surface, and the electromagnetic wave generated at that time is in the microwave band.

Non-Patent Document 1

E. Schlecht, G. Chattopadhyay, A. Maestrini, A. Fung, S. Martin, D. Pukala, J. Burston and I. Mehdi, "200, 400 and 800 GHz Schottky Diode "Substrateless" Multipliers: Design and Results" 2001 MMT-S International Microwave Symposium Digest, vol. 3, pp. 1649-1652, 2001.

Non-Patent Document 2

X. Melique, A. Maestrini, R. Farre, P. Mounaix, M. Favreau, O. Vanbesien, J-M. Goutoule, F. Mollot, G. Beaudin, T. Narhi, D. Lippens, "Fabrication and Performance of InP-based Heterostructure Barrier Varactors in a 250-GHz Waveguide Tripler" Microwave Theory and Techniques, IEEE Transactions on, vol. 48, no. 6, pp. 1000-1006, June 2000.

Non-Patent Document 3

M. Lampe, et al., "Submillimeter-Wave Production by Upshifted Reflection from a Moving Ionization Front", Year 1977

Non-Patent Document 4

C. S. Tsai and B. A. Auld, "Wave Interaction with Moving Boundaries", 1967

Non-Patent Document 5

Hiroshi Ito, Kiyoshi Hayata, "Doppler Frequency Transition of Electromagnetic Field Moving at High Speed", 1979

Non-Patent Document 6

J. R. Hoffman, et al., "High power radiation from ionization fronts in a static electric field in a waveguide", 2001

DISCLOSURE OF THE INVENTION

However, the conventional systems have following problems.

1) Since the conversion efficiency is rapidly lowered when the frequency conversion ratio (frequency multiplication ratio) is increased, a practical conversion ratio is limited to be at most a factor of 5 or less.

2) In a frequency band of short millimeter wave or higher exceeding 100 GHz, element characteristics are degraded, it becomes difficult to manufacture a precise and small resonator, its output is significantly decreased, and utility is lost.

3) Since a resonator for impedance matching is used, its resonant range is limited.

4) Since maximum allowable input power of a solid-state element is limited, large output can not be obtained.

From the above reasons, in the sub-millimeter wave band exceeding 300 GHz, according to the conventional multiplier, the present state is such that even in the doubled wave, the conversion efficiency is approximately 20% or less, and the output is 10 mW or less.

The invention has been made in view of the above, and has an object to provide a frequency converter and method in which for example, contrary to the conventional technique, without using a solid-state element having nonlinear characteristics, such as a varactor, and without requiring a complicated resonator structure such as a resonator for impedance matching, the Doppler effect on a high-frequency transmission line is used, and the operation is enabled in a wide frequency range from a microwave or millimeter wave to a terahertz wave. Besides, the invention has an object to enable a frequency conversion ratio (frequency multiplication ratio) to be easily adjusted by adjusting the structure of a light delay circuit and a high-frequency transmission line to change the transmission speed of light and an input/output wave.

Further, the invention has an object to achieve tasks as set forth below.

1) To enable generation of coherent electromagnetic waves of a short millimeter wave, sub-millimeter wave and terahertz wave band of 100 GHz or higher.

2) To easily achieve a high frequency conversion ratio exceeding a factor of 10 in a wide range and with high efficiency.

3) To obtain a continuous frequency variable output in a wide range extending 100% by changing an input frequency. This can not be attained by the conventional system having the resonator structure.

4) To enable high output power exceeding 1 W to be achieved even in a high frequency region of a short millimeter wave and sub-millimeter wave band. This is because the maximum allowable operation power of the invention is determined not by a low allowable input power of the solid-state element but by a high discharge breakdown voltage of the high-frequency transmission line. As a result, it becomes possible to use an input wave with a large power.

5) To facilitate circuit manufacture and design.

According to first solving means of the invention, there is provided a frequency converter using an optical excitation surface plasma, comprising:

a substrate in which an optical excitation surface plasma is produced and is for transmitting an input wave;

a high-frequency transmission line formed on the substrate and having a first and a second sides; and an optical delay circuit to give a transmission time difference to a laser beam and for irradiating the substrate with the laser beam, wherein the input wave is inputted from the first or the second side of the high-frequency transmission line and is reflected at the second side, the laser beam is made incident on the optical delay circuit, the laser beam is made to reach the high-frequency transmission line while the transmission time difference occurs according to a position of the high-frequency transmission line in a line direction by the optical delay circuit, the laser beam optically produces the surface plasma in the substrate through the optical delay circuit to short-circuit the high-frequency transmission line, the input wave reflected at the second side of the high-frequency transmission line is further reflected by the surface plasma, this reflection point is moved to the second side of the high-frequency transmission line to perform frequency conversion of the input wave based on a principle of a Doppler effect, and a frequency-converted output wave is outputted from the second side of the high-frequency transmission line.

According to second solving means of the invention, there is provided a frequency converter using an optical excitation surface plasma, comprising:

a substrate in which an optical excitation surface plasma is produced and is for transmitting an input wave;

a high-frequency transmission line formed on the substrate and having a first and a second sides; and an optical delay circuit to give a transmission time difference to a laser beam and for irradiating the substrate with the laser beam, wherein the input wave is inputted from the second side of the high-frequency transmission line, the laser beam is made incident on the optical delay circuit, the laser beam is made to reach the high-frequency transmission line while the transmission time difference occurs according to a position of the high-frequency transmission line in a line direction by the optical delay circuit, the laser beam optically produces the surface plasma in the substrate through the optical delay circuit to short-circuit the high-frequency transmission line, the input wave is reflected by the surface plasma, this reflection point is moved to the second side of the high-frequency transmission line to perform frequency conversion of the input wave based on a principle of a Doppler effect, and a frequency-converted output wave is outputted from the second side of the high-frequency transmission line.

According to third solving means of the invention, there is provided a frequency conversion method using an optical excitation surface plasma, wherein an input wave is inputted from a first side of a high-frequency transmission line formed on a substrate and is reflected at a second side, a laser beam is made incident on an optical delay circuit, the laser beam is made to reach the high-frequency transmission line while a transmission time difference occurs according to a position of the high-frequency transmission line in a line direction by the optical delay circuit, the laser beam optically produces the surface plasma in the substrate through the optical delay circuit to short-circuit the high-frequency transmission line, the input wave reflected at the second side of the high-frequency transmission line is further reflected by the surface plasma, this reflection point is moved to the second side of the high-frequency transmission line to perform frequency conversion of the input wave based on a principle of a Doppler effect, and a frequency-converted output wave is outputted from the second side of the high-frequency transmission line.

According to fourth solving means of the invention, there is provided a frequency conversion method using an optical excitation surface plasma, wherein an input wave is inputted from a second side of a high-frequency transmission line formed on a substrate, a laser beam is made incident on an optical delay circuit, the laser beam is made to reach the high-frequency transmission line while a transmission time difference occurs according to a position of the high-frequency transmission line in a line direction by the optical delay circuit, the laser beam optically produces the surface plasma in the substrate through the optical delay circuit to short-circuit the high-frequency transmission line, the input wave is reflected by the surface plasma, this reflection point is moved to the second side of the high-frequency transmission line to perform frequency conversion of the input wave based on a principle of a Doppler effect, and a frequency-converted output wave is outputted from the second side of the high-frequency transmission line.

DETAILED DESCRIPTION OF PREFERRED EMBODIMENTS OF THE INVENTION

1. First Embodiment

1-1. Structure

Figure 1:
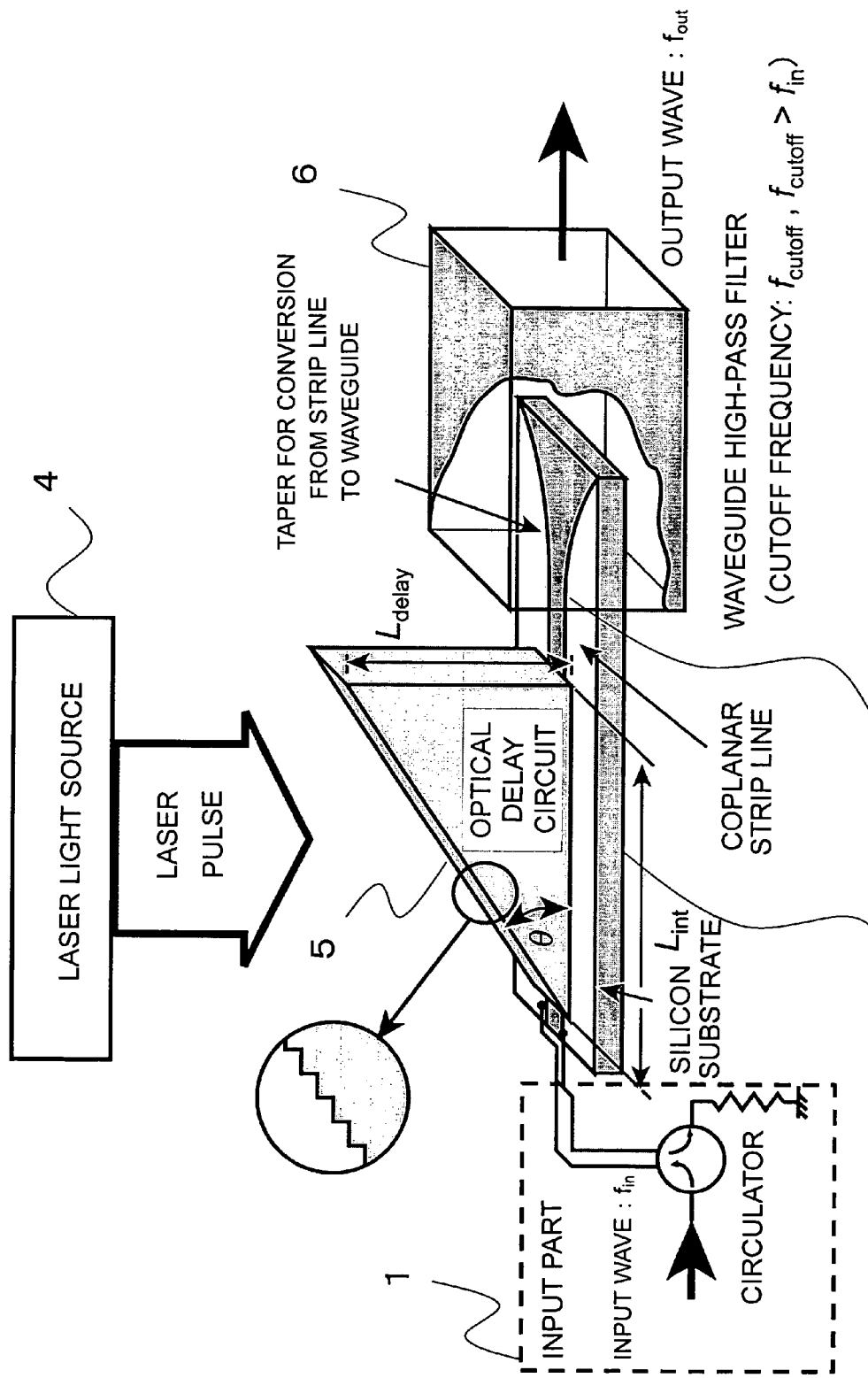
FIG. 1 is a structural view of a first embodiment of a frequency converter using an optical excitation surface plasma.

FIG. 1 is a structural view of a first embodiment of a frequency converter using an optical excitation surface plasma.

The frequency converter of this embodiment includes an input part 1, a high-frequency transmission line 2, a substrate 3, a laser light source 4, an optical delay circuit 5, and an output part 6.

The input part 1 inputs an input wave to the high-frequency transmission line 2. Besides, the input part 1 includes a frequency discriminator circuit such as, for example, a circulator. The high-frequency transmission line 2 is formed on the substrate 3, and transmits an input wave and an output wave. The high-frequency transmission line 2 includes, for example, a coplanar line or a slot line, and a waveguide circuit and the like. For example, the high-frequency transmission line 2 can be formed by evaporating at least two lines onto the substrate 3. As the substrate 3, for example, a semiconductor substrate of silicon (Si), gallium arsenide (GaAs), indium system or the like, or a semiconductor substrate having high insulating properties may be used. Incidentally, in this embodiment, as an example, a silicon semiconductor substrate is used as the substrate 3, and a coplanar strip line with a relatively flat frequency characteristic is used as the high-frequency transmission line 2. Besides, the high-frequency transmission line 2 (for example, strip line) can include a matching part (for example, a taper for conversion) to the output part 6 (for example, waveguide) in order to improve matching properties. As the laser light source 4, a suitable laser such as a Ti:Saphire laser is used. The output part 6 includes, for example, various filter circuits, such as waveguides, as an input/output branch circuit (frequency discriminating branch circuit). Besides, the output part 6 sets the cutoff frequency $f_{cutoff}$ of the waveguide to be larger than the maximum frequency of an input wave, so that the input wave is total-reflected, and only an output wave can be extracted.

The optical delay circuit 5 delays a laser beam and makes it incident on the high-frequency transmission line 2 and the substrate 3. Besides, in this embodiment, the optical delay circuit 5 uses a decrease in light speed in quartz. In the optical delay circuit 5, by the length of the light path length of the laser beam transmitted through the triangle quartz, the time when the laser beam reaches the substrate 3 varies according to the position of the high-frequency transmission line 2 in the line direction. Thus, a surface plasma excited in the substrate 3 moves at high speed in the direction from the input part 1 to the output part 6. When an interaction length between the optical excitation plasma and the electromagnetic wave is $L_{int}$, and a maximum length of the quartz part is $L_{delay}$, an equivalent traveling speed $V_{opt}$ of the optical excitation surface plasma on the high-frequency transmission line 2 is given by the following expression.

$$v_{opt} = c \frac{L_{int}}{L_{delay}(n-1)} \tag{1}$$

Where, c denotes light speed, and n denotes the refractive index of a dielectric. By this, when the transmission speeds $V_{in}$ and $V_{out}$ of the input wave and the output wave in the high-frequency transmission line 2, and the interaction length $L_{int}$ are determined, the optical delay circuit 5 can be designed in accordance with a required frequency conversion ratio (frequency multiplication ratio) G. Besides, the frequency conversion ratio G will be described later. Here, in order that the laser light source 4 makes the laser beam vertically incident on the optical delay circuit 5, a flat part longer than the wavelength of the light is provided on the incident plane. Since the wavelength of the light is sufficiently shorter than the wavelength of the incident wave and the reflected wave, discontinuous of the light wave plane can be neglected.

Incidentally, the respective portions are not limited to the foregoing, and other various circuit structures can be adopted.

1-2. Operation

Figure 2:
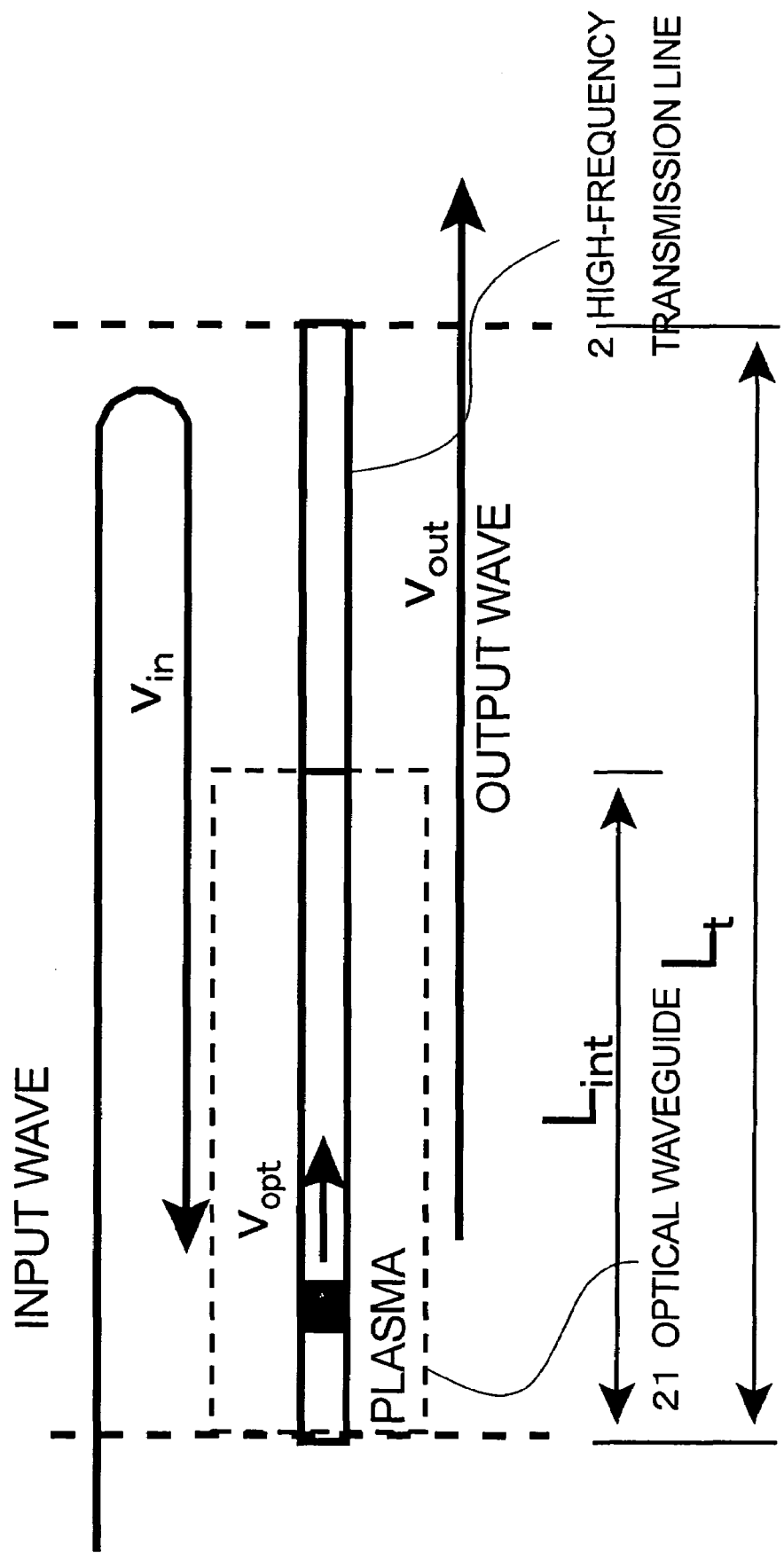
FIG. 2 is a principle view of a frequency converter system using an optical excitation surface plasma.

FIG. 2 is a principle view of a frequency conversion system using an optical excitation surface plasma. This circuit includes a high-frequency transmission line 2, and a light waveguide 21. The length of the optical waveguide 21 on the transmission line, that is, the length (interaction length) where the optical excitation surface plasma occurs is $L_{int}$, the length to a filter is $L_f$, and the excitation speed of the plasma is $v_{opt}$. Here, it is assumed that the transmission speed $v_{in}$ of the input wave is always higher than $v_{opt}$. In the drawing, the input wave is made incident from the left side by the input part 1, and is reflected at the waveguide part of the output part 6 or at the end of the coplanar strip line of the high-frequency transmission line 2. At this time, when the laser beam is made incident by the laser light source 4, the laser beam transmitted through the optical waveguide 21 produces an electron-hole plasma on the surface of the semiconductor substrate to short-circuit the high-frequency transmission line 2, and the input wave (microwave or millimeter wave) is reflected. The reflection point, together with the laser beam, moves at high speed, so that the frequency conversion (up-conversion) is performed based on the same principle as the Doppler effect. The output part 6 outputs the reflected output wave.

The frequency conversion ratio G in this embodiment is determined by the following expression, where the movement speed of the optical excitation plasma, that is, the delay speed of the optical pulse is $V_{opt}$, and the transmission speeds of the input wave and the output wave transmitted through the high-frequency transmission line 2 are $v_{in}$ and $v_{out}$. Besides, a theoretical energy conversion efficiency $\xi$ becomes 1/G from the operation principle.

$$G = \frac{1 + v_{opt}/v_{in}}{1 - v_{opt}/v_{out}} \tag{2}$$

Hereinafter, timings of the respective pulses of the input wave, the laser beam, and the output wave will be described.

Figure 3:
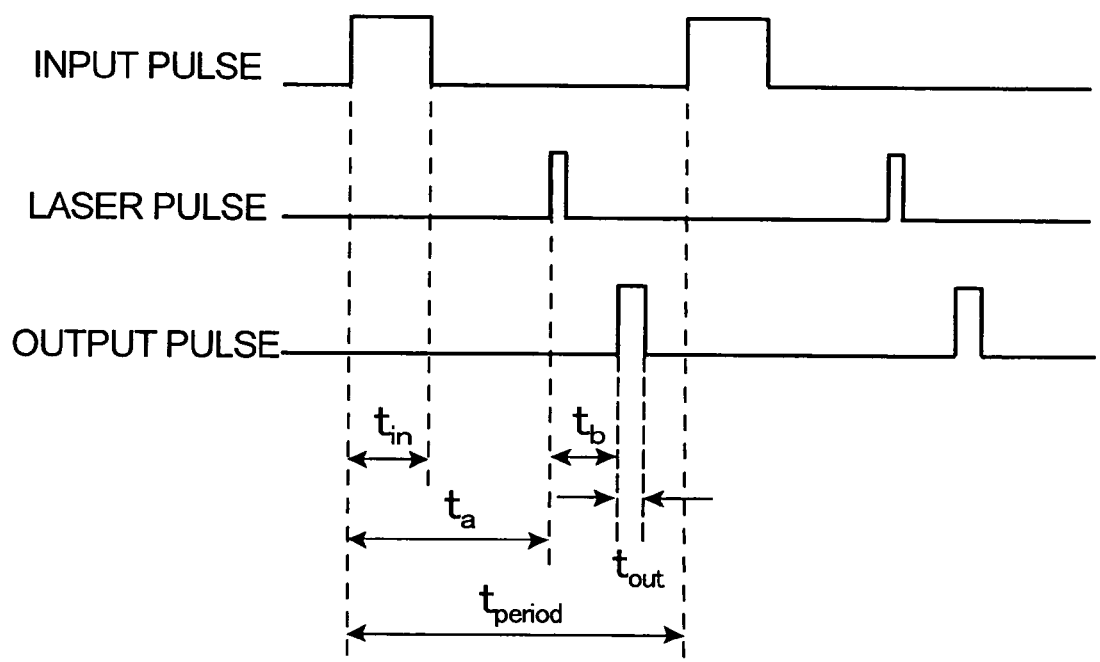
FIG. 3 is a view of a timing chart in a case where input is a pulse wave.

FIG. 3 is a view of a timing chart in the case where the input is a pulse wave.

The input pulse with an input pulse width tin is inputted from the left side of the high-frequency transmission line 2. The input pulse is transmitted through the high-frequency transmission line 2 to the right side at a transmission speed $v_{in}$, is reflected at the output part 6, and is transmitted through the high-frequency transmission line 2 to the left side at the transmission speed $v_{in}$. Here, in the case where when the input pulse meets just the left end of the optical waveguide 21 in FIG. 2, a plasma is excited there, the timing time of the laser pulse becomes $t_a=2L_t/v_{in}$. At this time, the plasma is produced in the optical waveguide 21, and the plasma travels through the high-frequency transmission line 2 toward the right while reflecting the input pulse. The reflected output wave is transmitted as the output wave of the transmission speed $v_{out}$ through the high-frequency transmission line 2, and is outputted as the output pulse from the output part 6 after an outgoing time $t_b=L_t/v_{out}$ from the timing time of the laser pulse. Here, the pulse width $t_{out}$ is a shorter one of $t_{out}=(L_{int}/v_{opt})\times(1-v_{opt}/v_{out})$ and $t_{in}\times(1-v_{opt}/v_{out})/(1+v_{opt}/v_{in})$.

After the output pulse is outputted, when the input pulse is again inputted, the output pulse can be obtained repeatedly. On the assumption that the periods of the input pulse and the laser pulse satisfy the condition of $t_{period}>t_a+t_b+t_{out}$, the output pulse is outputted at this period $t_{period}$. Incidentally, the relaxation time of an optically excited carrier in the semiconductor is neglected. Strictly, this relaxation time can be added to the period.

Next, a description will be given to the case where the input is a continuous wave.

Figure 4:
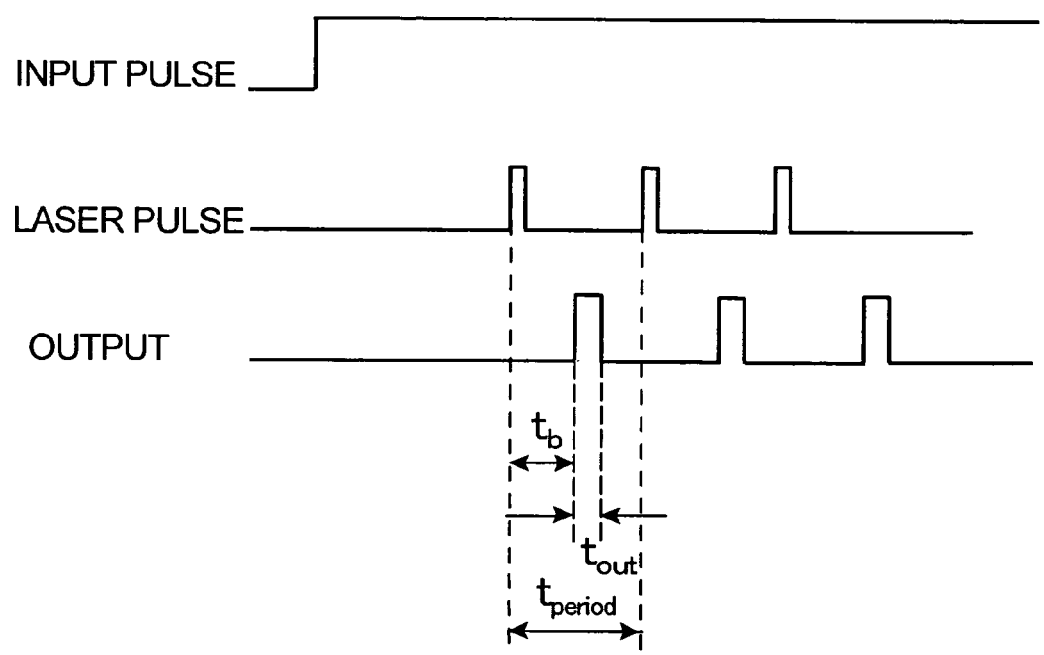
FIG. 4 is a view of a timing chart in a case where input is a continuous wave.

FIG. 4 is a view of a timing chart in the case where the input is the continuous wave.

In this case, the input wave is transmitted through the high-frequency transmission line 2 from the left side to the right at a transmission speed $v_{in}$, and is reflected at the output part 6 to travel through the high-frequency transmission line 2 to the left at a transmission speed $v_{in}$. Here, when a laser pulse is incident on the optical waveguide 21 by the laser light source 4 at an arbitrary time, a plasma is produced on the high-frequency transmission line 2, and the plasma reflects the input wave. The reflected output wave becomes an output pulse of a transmission speed $v_{out}$, is transmitted through the high-frequency transmission line 2, and is outputted from the output part 6 after $t_b=L_t/v_{out}$ from the timing time of the laser pulse. Here, the output pulse width $t_{out}$ is $t_{out}=(L_{int}/v_{opt})\times(1-v_{opt}/v_{out})$. Incidentally, an equivalent pulse width of the input corresponding to the output pulse is given by $t_{in}=t_{out}(1+v_{opt}/v_{in})/(1-v_{opt}/v_{out})$. It is assumed that the period of the laser pulse satisfies the condition of $t_{period}>t_b+t_{out}$, the output wave is outputted at this period $t_{period}$.

2. Second Embodiment

2-1. Structure

Figure 5:
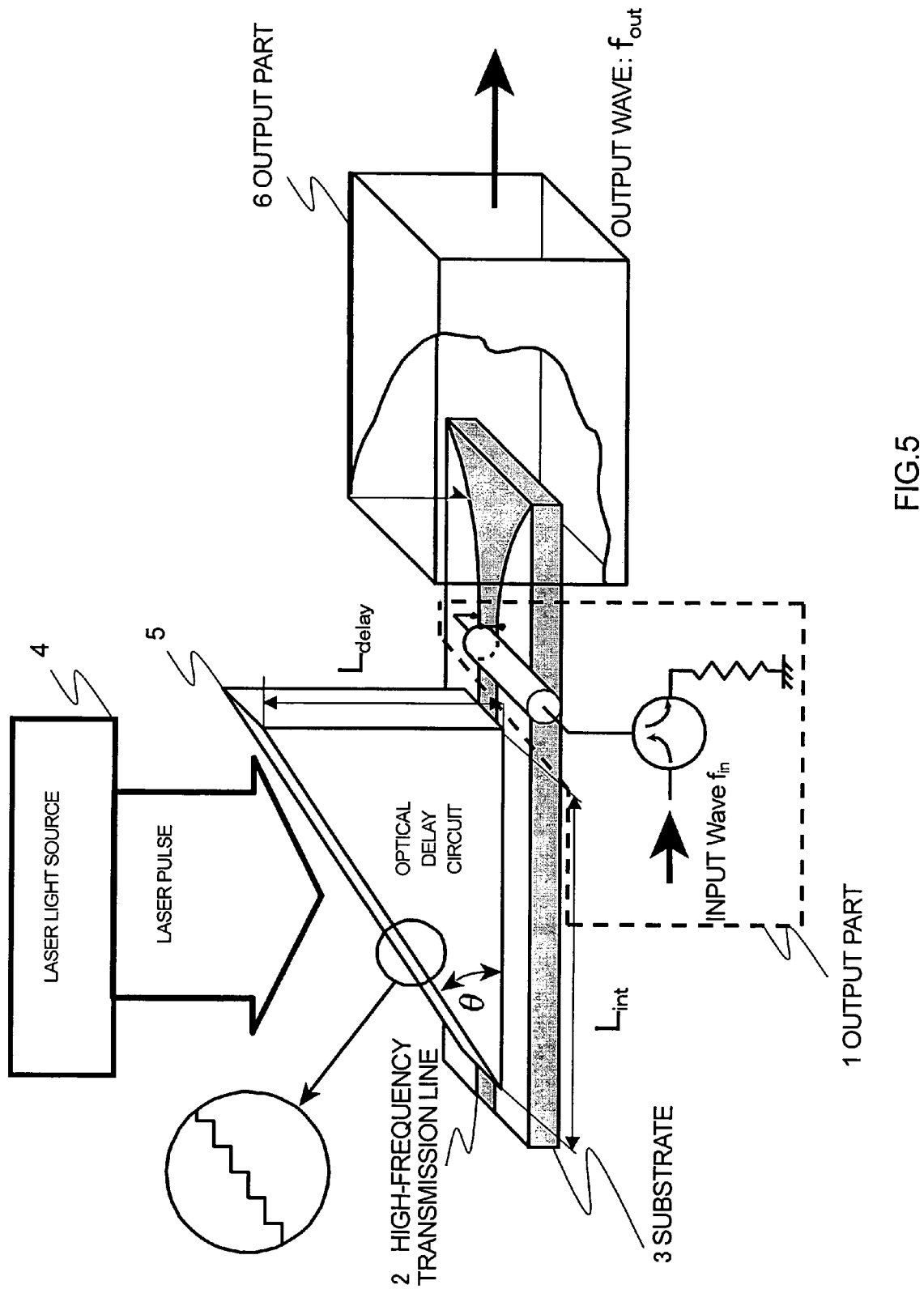
FIG. 5 is a structural view of a second embodiment of a frequency converter using an optical excitation surface plasma.

FIG. 5 is a structural view of a second embodiment of a frequency converter using an optical excitation surface plasma. In this embodiment, an example is shown in which a feed point of an input wave by an input part 1 is positioned at an output filter side of an output part 6. Structures of other respective parts are the same as the first embodiment.

The frequency converter includes an input part 1, a high-frequency transmission line 2, a substrate 3, a laser light source 4, an optical delay circuit 5, and an output part 6. In this embodiment, as an example, the simplest and general coaxial line is used for the feeding of the input wave of the input part 1, however, in addition to this, it is also possible to use a microstrip line or a waveguide. Besides, as the structure for supplying the input wave, when the feed position and the shape are also considered, the number of the combinations thereof is large, and a suitable structure can be adopted. This structure is selected according to the frequency to be used, its range, and a use of the output.

The input wave given from the input part 1 is fed to the coplanar strip line of the high-frequency transmission line 2 by the coaxial line. Since this input wave is total-reflected (or substantially total-reflected) by the filter part (waveguide high-pass filter) of the output part 6 or the end of the coplanar strip line of the high-frequency transmission line 2, it is transmitted to the optical delay circuit 5 side. The distance (feeding point position) between the output filter of the output part 6 and the coaxial line of the input part 1 is adjusted in order to maximize the transmission power. Besides, by using that the output frequency $f_{out}$ is higher than the input frequency $f_{in}$, the length of the connection line between the coaxial line and the coplanar strip line is adjusted so that it has sufficiently large impedance for an output frequency $f_{out}$. In this way, it is possible to prevent the output power from flowing to the input coaxial line side of the input part 1, and most of it can be transmitted to the output filter side of the output part 6.

Incidentally, in the second embodiment, in order to efficiently send the input power to the circuit, it is necessary to adjust the distance from the output filter of the output part 6 to the feeding position of the input wave of the input part 1 in accordance with the input frequency $f_{in}$. Thus, in a circuit in which the position is fixed, there is a case where the operation frequency range is limited. On the other hand, in the first embodiment (the feeding position is located at the left), since there is no such limitation, a more wideband operation becomes possible.

2-2. Operation

Figure 6:
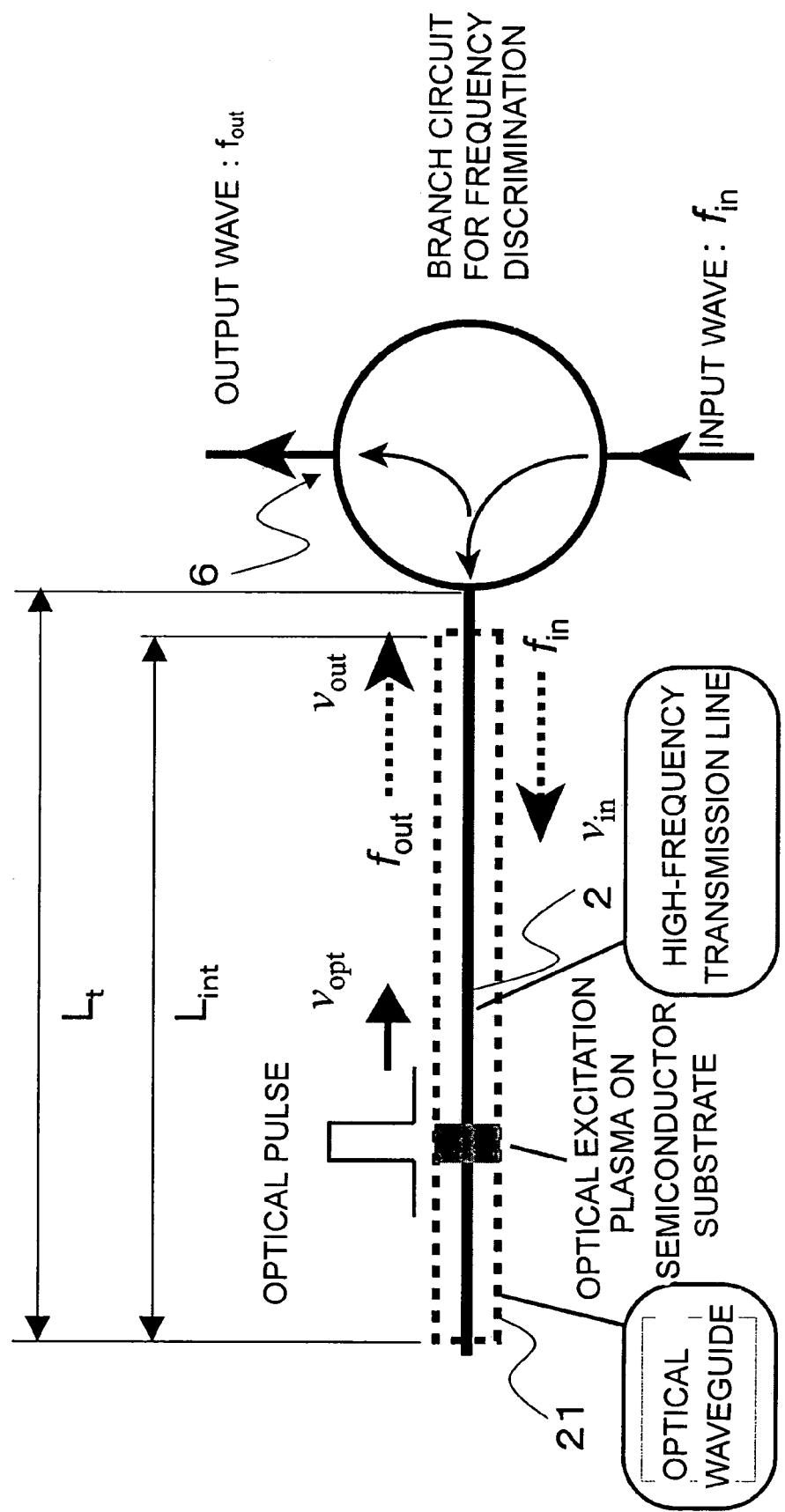
FIG. 6 is a principle view of a frequency conversion system using the optical excitation surface plasma in the second embodiment.

FIG. 6 is a principle view of a frequency conversion system using the optical excitation surface plasma in the second embodiment.

This drawing shows a case where the input wave in FIG. 2 is incident from the right side of the high-frequency transmission line 2, and the high-frequency transmission line 2 and the optical waveguide 21 are the same. The input wave is inputted from the right side of the high-frequency transmission line 2 by the input part 1. At this time, when a laser beam is made incident by the laser light source 4, the laser beam transmitted through the optical waveguide 21 produces an electron-hole plasma on the surface of the semiconductor substrate to short-circuit the high-frequency transmission line 2, and the input wave (microwave or millimeter waver) is reflected. This reflection point moves at high speed together with the laser beam, so that frequency conversion (up-conversion) is performed based on the same principle as the Doppler effect. The output part 6 outputs the reflected output wave. Incidentally, as the frequency discriminating branch circuit (frequency filter) of the output part 6, it is possible to use, for example, one which divides a path by merely using a frequency difference of the input and output, not a resonator structure. The frequency conversion ratio G is similar to one explained in the first embodiment. Besides, with respect to the timing chart, since the input wave from the input part 1 is inputted from the right side of the high-frequency transmission line 2, the timing time $t_a$ of the first embodiment becomes a timing time $t_a'=L_t/v_{in}$.

3. Third Embodiment

In the first and the second embodiments, the almost continuous reflection of the incident wave has been dealt with. However, from the operation principle of the invention, even if the reflection point by the optical excitation plasma moves discontinuously, the frequency conversion operation is possible.

Figure 7:
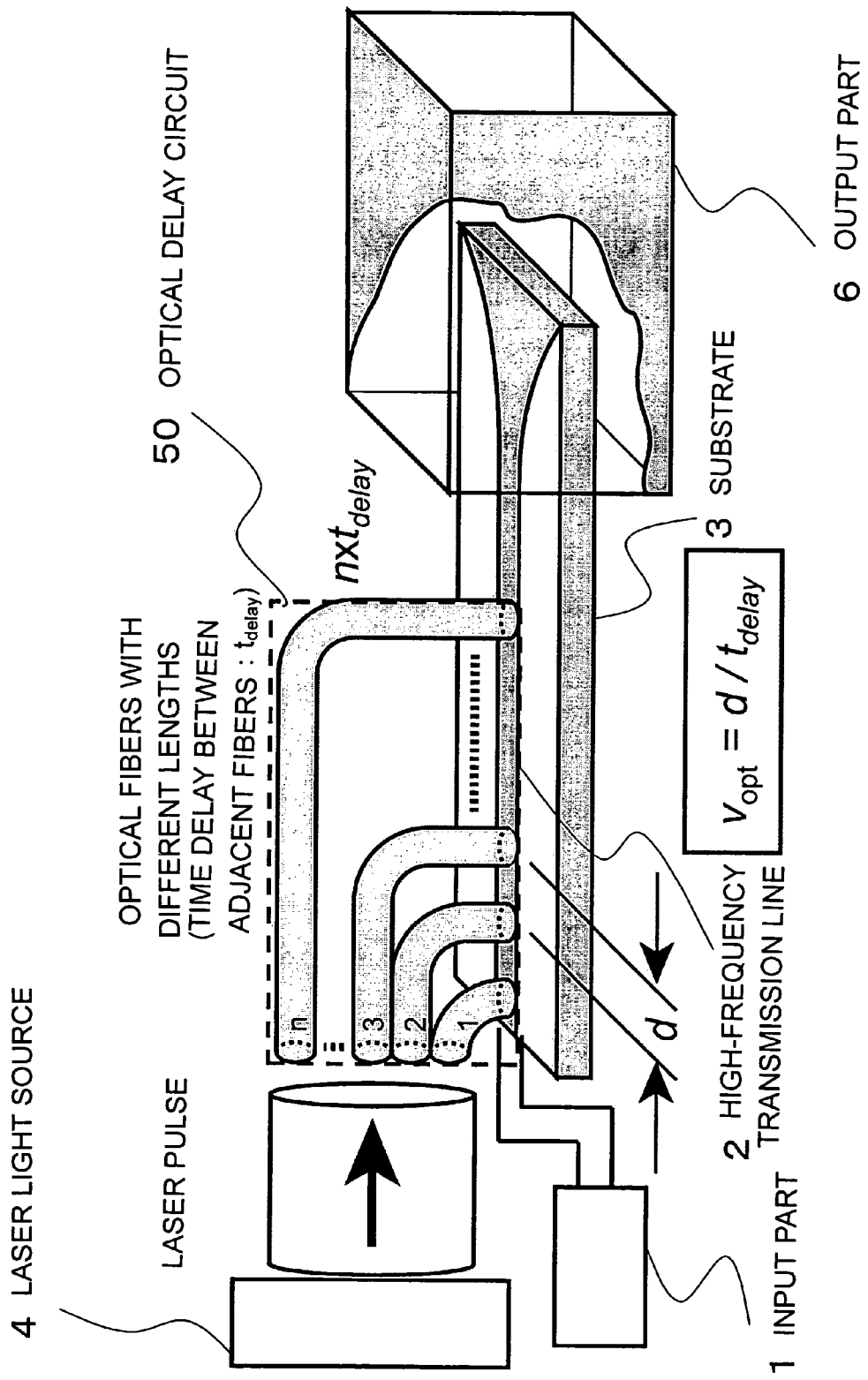
FIG. 7 is a structural view of a third embodiment of a frequency converter using an optical excitation surface plasma.

FIG. 7 is a structural view of a third embodiment of a frequency converter using an optical excitation surface plasma. In this embodiment, optical fibers are used for the optical delay circuit 5.

The frequency converter includes an input part 1, a high-frequency transmission line 2, a substrate 3, a laser light source 4, an optical delay circuit 50, and an output part 6. Structures except the optical delay circuit 50 are the same as the first embodiment. Besides, in this embodiment, the optical fibers as the optical delay circuit 50 are disposed between coplanar strip lines, and arrangement is made such that an interval between the centers of the sections of the adjacent optical fibers is d. Incidentally, the interval between the adjacent optical fibers may be eliminated. Here, when a time delay between the adjacent optical fibers is made $t_{delay}$, the time delay of the nth optical fiber becomes $n \times t_{delay}$. When the length of the optical fiber is adjusted, and the delay time $t_{delay}$ between the adjacent optical fibers is changed, a movement speed $v_{opt}$ of an effective optical plasma can be relatively freely determined. Besides, the movement speed $v_{opt}$ of the optical plasma transmitted through the high-frequency transmission line 2 is determined by the following expression.

$$V_{opt} = d/t_{delay} \tag{3}$$

A merit of this structure is that the optical delay circuit 50 can be designed to be relatively small and with a high degree of freedom. Besides, in this structure, the frequency $f_{out}$ of the output wave includes, in addition to a frequency component simply larger by a factor of the frequency conversion ratio G than the frequency $f_{in}$ of the input wave, harmonic components generated from the discontinuity of the waveform. However, when the interval d between adjacent optical fibers is set to be ¼ or less of the distance corresponding to one wavelength of the input wave in the high-frequency transmission line 2, these components can be significantly decreased.

Besides, also in this embodiment, as in the second embodiment, the circuit can be suitably constructed, for example, the input part 1 is disposed at the right side of the high-frequency transmission line 2. Incidentally, the operation is the same as the first embodiment in the case where the input part 1 is arranged at the left side of the high-frequency transmission line 2, and is the same as the second embodiment in the case where it is arranged at the right side of the high-frequency transmission line 2.

4. Frequency Conversion Expression

Hereinafter, the derivation of the expression (2) will be described.

Figure 8:
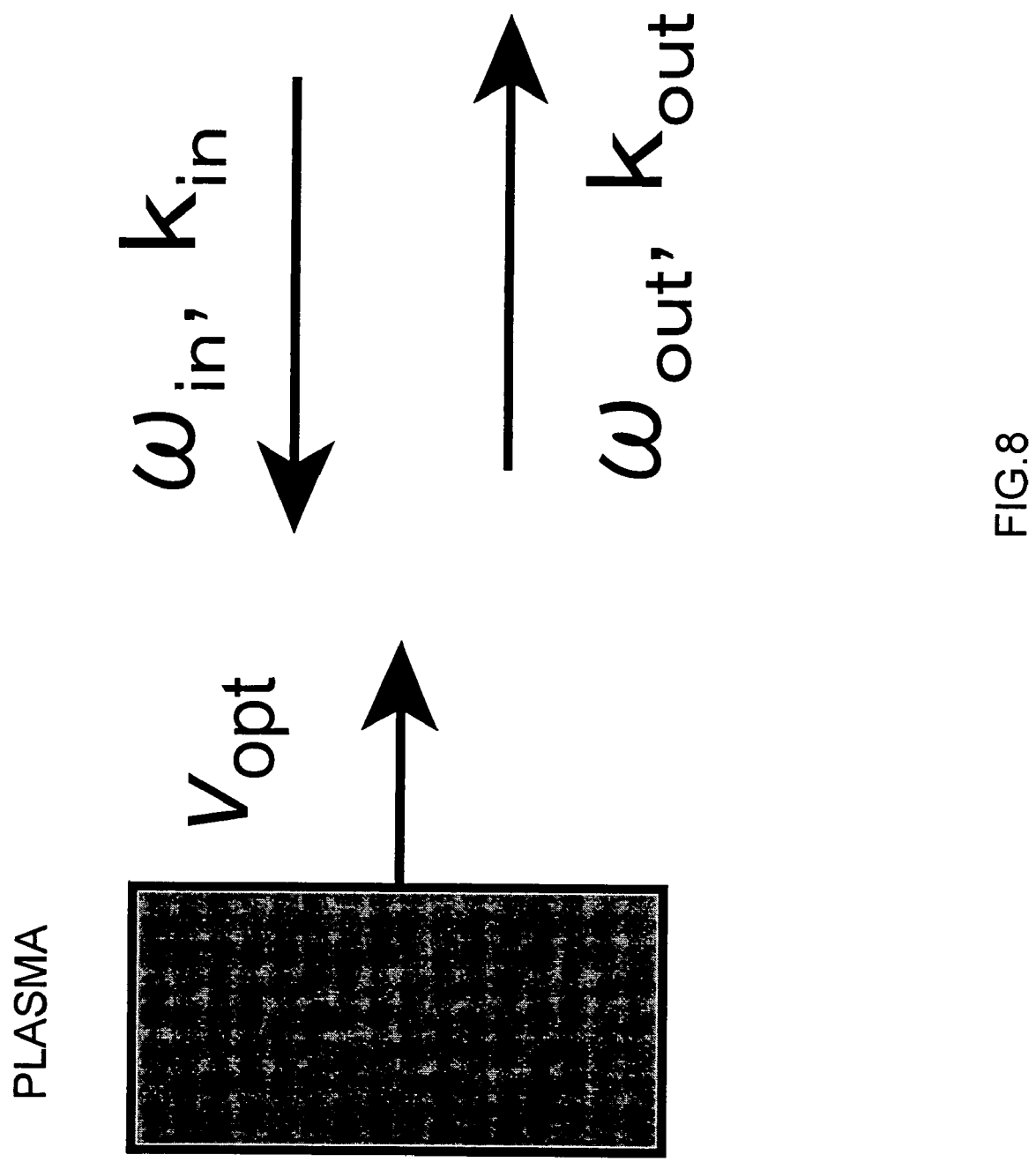
FIG. 8 is a view showing a state in which an input wave is reflected by a plasma boundary moving at a speed $V_{opt}$.

FIG. 8 is a view showing a state in which an input wave is reflected at a plasma boundary moving at a speed $v_{opt}$.

The expression (2) expresses the frequency conversion expression by the Doppler effect in a more general form, and the derivation itself of the expression is quite the same as a normal one. As shown in the drawing, the input wave is reflected at the plasma boundary moving at the speed $v_{opt}$.

At this time, there is a principle (the principle of phase equality) that the phase changes of the input wave and the output wave at the boundary surface must be the same (see C. S. Tsai and B. A. Auld, "Wave Interaction with Moving Boundaries", J. Appl. Phys., vol. 38, no. 5, pp. 2106-2115, 1967).

From this, the following expression is established.

$$\omega_{in} + k_{in} v_{opt} = \omega_{out} - k_{out} v_{opt} \tag{4}$$

Where, ω denotes a frequency, and k denotes a propagation constant. The expression (4) is modified and the following expression is obtained. Subscripts "in" and "out" denote the input wave and the output wave, respectively.

$$G = \frac{\omega_{out}}{\omega_{in}} = \frac{1 + v_{opt} \frac{k_{in}}{\omega_{in}}}{1 - v_{opt} \frac{k_{out}}{\omega_{out}}} \tag{5}$$

Where, the relation of $v_{in} = \omega_{in}/k_{in}$ and $v_{out} = \omega_{out}/k_{out}$ is used, and the expression (2) is derived.

Incidentally, for reference, it is assumed that the medium through which the wave is transmitted is uniform and which has no frequency characteristic, and in the case of $v_{in} = v_{out}$, when the transmission medium of waves is a free space ($v_{in} = v_{out} = c$, c: light speed), the following is obtained.

$$G = \frac{\omega_{out}}{\omega_{in}} = \frac{1 + v_{opt}/c}{1 - v_{opt}/c}$$

5. ACTUAL EXAMPLE

Figure 9:
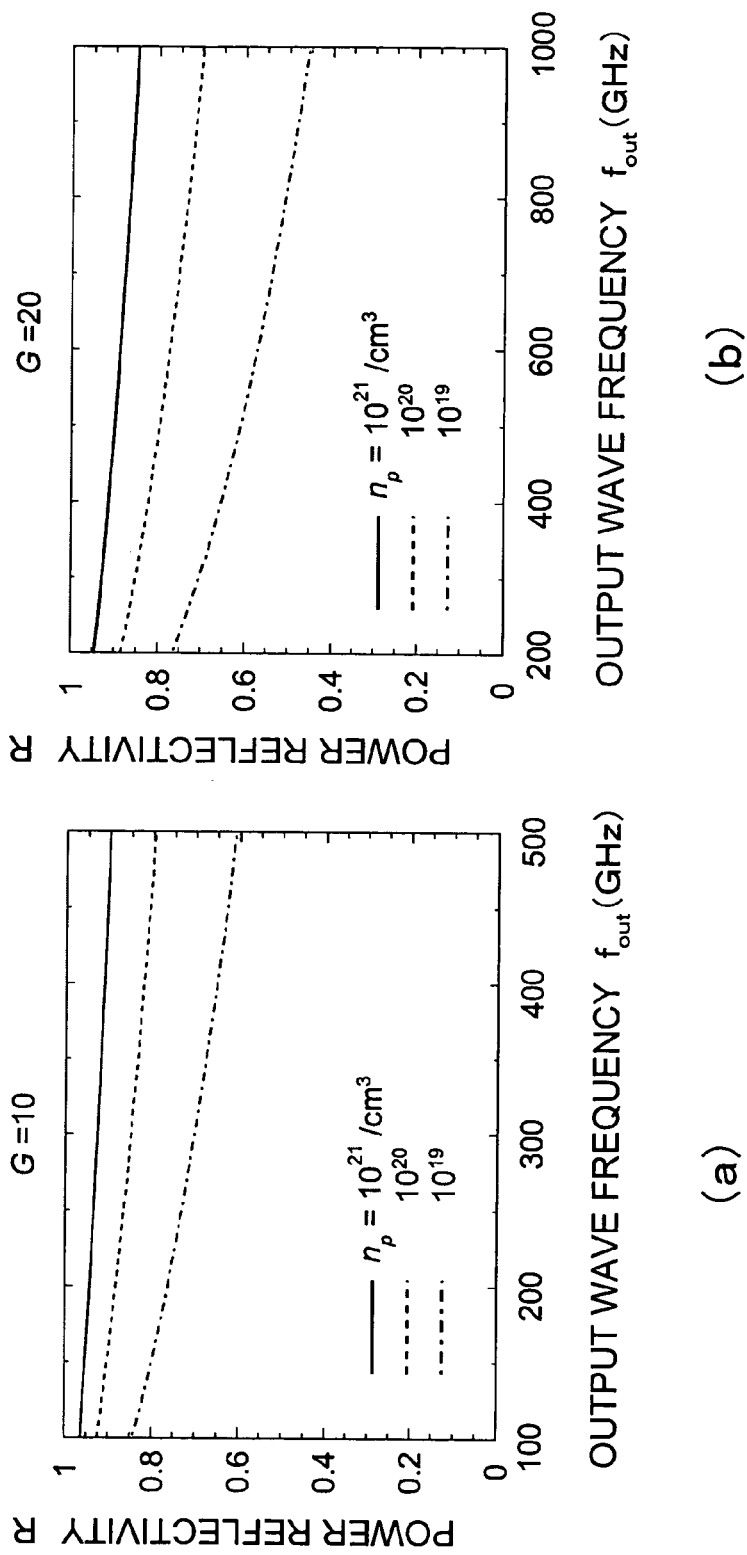
FIG. 9 is a view showing calculation results concerning an output frequency $f_{out}$ and a power reflectivity R.

FIG. 9 is a view showing calculation results concerning the output frequency $f_{out}$ and the power reflectivity R. FIG. 9(a) shows a case where the frequency conversion ratio is G=10, and FIG. 9(b) shows a case where the frequency conversion ratio is G=20. The parameter is a density $n_p$ of a plasma (carrier) in the silicon plate produced by the laser beam. Calculation conditions are as follows:

input frequency $f_{in}$;
   10 GHz to 50 GHz
output frequency $f_{out}$;
   100 GHz to 500 GHz (frequency conversion ratio G=10)
   200 GHz to 1000 GHz (frequency conversion ratio G=20)
laser;
   Ti: Saphire laser system
   wavelength 532 nm
   maximum output energy 1 mJ
   pulse width 2 psec
high-frequency transmission line 2;
   kind coplanar strip line
   line impedance 100Ω
   distance between lines 20 μm
   transmission speed c/2.5 (assumed to be constant)
   interaction distance $L_{int}$ 30 mm In this calculation, from the easiness of the analysis, it is assumed that the transmission speeds of the input wave and the output wave in the high-frequency transmission line 2 are constant in the whole range of the calculation. Actually, when the frequency exceeds 500 GHz, the transmission speed is lowered, and as a result, the frequency conversion ratio G becomes large. However, in this calculation, the effect is neglected. Besides, from the same reason, the calculation is made on the assumption that there is no transmission loss in the high-frequency transmission line 2. From the results, it is understood that by using a semiconductor plasma with a relatively low density, that is, a carrier density of $10^{21}$ cm$^{-3}$ (corresponding to pulse energy of 1 mJ), the electromagnetic wave of 1 THz can be obtained at a power reflectivity R=80% or more. In case the input wave having a power of 100 W is used, an output power of 80 W is obtained. This value can not be obtained by the conventional solid-state device.

The total energy conversion efficiency $\xi$ in view of the conversion of pulse widths of the input wave and the output wave is 1/G of the power reflectivity R, that is, R/G. Accordingly, in the results of FIG. 9(*a*), the frequency conversion ratio G=10, output frequency $f_{out}$=500 GHz, and power reflectivity R=90% correspond to the energy conversion efficiency $\xi$=9%. Besides, in the results of FIG. 9(*b*), the frequency conversion ratio G=20, output frequency $f_{out}$=1000 GHz, and power reflectivity R=85% correspond to the energy conversion efficiency $\xi$=4.2%. When the high frequency conversion ratio G is considered, the value of the energy conversion efficiency $\xi$ of these is a sufficiently high value. As stated above, the frequency converter and its method of the embodiment are useful for generation of high output and high frequency. From this, high output pulse generation, which has conventionally been able to be obtained only by an electron tube such as a klystron, becomes possible, and application to a small millimeter band radar system of only a solid-state device becomes possible.

In this embodiment, it is assumed that the optical excitation surface plasma itself is still, and only its boundary surface moves. In this case, differently from a case where a reflector actually moves, amplification of the reflected wave amplitude does not occur. Accordingly, under ideal conditions, the power conversion efficiency $\eta_p$ becomes 1, and the energy conversion efficiency $\xi$ becomes 1/G by the pulse width compression effect of the reflected wave. Besides, a decrease in the energy conversion efficiency $\xi$ at the time of frequency conversion does not depend on the operation frequency itself.

INDUSTRIAL APPLICABILITY

The invention has been made in view of the above, and has an advantage to provide a frequency converter and method in which for example, contrary to the conventional technique, without using a solid-state element having non-linear characteristics, such as a varactor, and without requiring a complicated resonator structure such as a resonator for impedance matching, the Doppler effect on a high-frequency transmission line is used, and the operation is enabled in a wide frequency range from a microwave or millimeter wave to a terahertz wave. Besides, the invention has an advantage to enable a frequency conversion ratio (frequency multiplication ratio) to be easily adjusted by adjusting the structure of a light delay circuit and a high-frequency transmission line to change the transmission speed of light and an input/output wave.

Further, the invention has an advantage to achieve tasks as set forth below.

1) To enable generation of coherent electromagnetic waves of a short millimeter wave, sub-millimeter wave and terahertz wave band of 100 GHz or higher.

2) To easily achieve a high frequency conversion ratio exceeding a factor of 10 in a wide range and with high efficiency.

3) To obtain a continuous frequency variable output in a wide range extending 100% by changing an input frequency. This can not be attained by the conventional system having the resonator structure.

4) To enable high output power exceeding 1 W to be achieved even in a high frequency region of a short millimeter wave and sub-millimeter wave band. This is because the maximum allowable operation power of the invention is determined not by a low allowable input power of the solid-state element but by a high discharge breakdown voltage of the high-frequency transmission line. As a result, it becomes possible to use an input wave with a large power.

5) To facilitate circuit manufacture and design.

The invention claimed is:

1. A frequency converter using an optical excitation surface plasma, comprising:

a substrate in which an optical excitation surface plasma is produced and is for transmitting an input wave;

an output part, including a waveguide, to total-reflect or substantially total-reflect the input wave and to allow the output Wave to pass through by setting a cutoff frequency of the waveguide to be larger than a maximum frequency of the input wave;

a high-frequency transmission line formed on the substrate and having first and second sides, including a matching part to the waveguide of the output part at the second side in order to improve matching properties; and an optical delay circuit to give a transmission time difference to a laser beam and for irradiating the substrate with the laser beam, wherein:

the input wave is inputted from the first or the second side of the high-frequency transmission line and is reflected at the second side, the laser beam is made incident on the optical delay circuit, the laser beam is made to reach the high-frequency transmission line while the transmission time difference occurs according to a position of the high-frequency transmission line in a line direction by the optical delay circuit, the laser beam optically produces the surface plasma in the substrate through the optical delay circuit to short-circuit the high-frequency transmission line, the input wave reflected at the second side of the high-frequency transmission line is further reflected by the surface plasma, this reflection point is moved to the second side of the high-frequency transmission line to perform frequency conversion of the input wave based on a principle of a Doppler effect, and a frequency-converted output wave is outputted from the output part through the matching part of the second side of the high-frequency transmission line.

2. A frequency converter using an optical excitation surface plasma according to claim 1, wherein the optical delay circuit includes a triangular quartz, and is disposed so that a transmission distance of the laser beam is short at the first side of the high-frequency transmission line and is long at the second side, and the laser beam is made incident on the optical delay circuit vertically to the substrate, and the optical excitation plasma is moved by using difference of decrease in light speed in the quartz.

3. A frequency converter using an optical excitation surface plasma according to claim 2, wherein plural flat parts each longer than a wavelength of the laser beam are provided at a laser beam incident surface of the optical delay circuit stepwise and vertically to an incident direction of the laser beam.

4. A frequency converter using an optical excitation surface plasma according to claim 1, wherein:

the optical delay circuit includes plural optical fibers disposed at predetermined intervals between lines of the high-frequency transmission line, and is disposed so that a transmission distance of the laser beam becomes short at the first side of the high-frequency transmission line and becomes long at the second side, and the laser beam is made incident on the optical delay circuit, and the optical excitation surface plasma is moved by using difference of decrease in light speed in the plural optical fibers.

5. A frequency converter using an optical excitation surface plasma according to claim 1, wherein the high-frequency transmission line includes a coplanar line or a slot line.

6. A frequency converter using an optical excitation surface plasma according to claim 1, wherein a frequency conversion ratio or a frequency multiplication ratio G is determined by an expression:

$$G = \frac{1 + v_{opt}/v_{in}}{1 - v_{opt}/v_{out}}$$

wherein a moving speed of the optical excitation plasma is $v_{opt}$, speeds of the incident wave and reflected wave transmitted through the high-frequency transmission line are $v_{in}$ and $v_{out}$ respectively.

7. A frequency converter using an optical excitation surface plasma, comprising:

a substrate in which an optical excitation surface plasma is produced and is for transmitting an input wave;

an output part, including a waveguide, to total-reflect or substantially, total-reflect the input wave and to allow the output wave to pass through by setting a cutoff frequency of the waveguide to be larger than a maximum frequency of the input wave;

a high-frequency transmission line formed on the substrate and having first and second sides, including a matching part to the waveguide of the output part at the second side in order to improve matching properties; and an optical delay circuit to give a transmission time difference to a laser beam and for irradiating the substrate with the laser beam, wherein:

the input wave is inputted from the second side of the high-frequency transmission line, the laser beam is made incident on the optical delay circuit, the laser beam is made to reach the high-frequency transmission line while the transmission time difference occurs according to a position of the high-frequency transmission line in a line direction by the optical delay circuit, the laser beam optically produces the surface plasma in the substrate through the optical delay circuit to short-circuit the high-frequency transmission line, the input wave is reflected by the surface plasma, this reflection point is moved to the second side of the high-frequency transmission line to perform frequency conversion of the input wave based on a principle of a Doppler effect, and a frequency-converted output wave is outputted from the output part through the matching part of second side of the high-frequency transmission line.

8. A frequency conversion method using an optical excitation surface plasma, wherein:

an input wave is inputted from a first side of a high-frequency transmission line which is formed on a substrate and includes a matching part to the waveguide of the output part at a second side of the high-frequency transmission line, in order to improve matching properties, and is reflected at the second side, a laser beam is made incident on an optical delay circuit, the laser beam is made to reach the high-frequency transmission line while a transmission time difference occurs according to a position of the high-frequency transmission line in a line direction by the optical delay circuit, the laser beam optically produces the surface plasma in the substrate through the optical delay circuit to short-circuit the high-frequency transmission line, the input wave reflected at the second side of the high-frequency transmission line is further reflected by the surface, plasma, this reflection point is moved to the second side of the high-frequency transmission line to perform frequency conversion of the input wave based on a principle of a Doppler effect, a cutoff frequency of a waveguide of an output part is set for be larger than a maximum frequency of the input wave to total-reflect or substantially total-reflect the input wave and to allow the output wave to pass through, and a frequency-converted output wave is outputted from the output nart through the matching part of the second side of the high-frequency transmission line.

9. A frequency conversion method using an optical excitation surface plasma according to claim 8, wherein:

a transmission distance of the laser beam becomes short at the first side of the high-frequency transmission line and becomes long at the second side by the optical delay circuit, and the optical excitation surface plasma is moved by using difference of decrease in light speed of the laser beam by the optical delay circuit.

10. A frequency conversion method using an optical excitation surface plasma according to claim 8, wherein:

a frequency conversion ratio or a frequency multiplication ratio G is determined by an expression:

$$G = \frac{1 + v_{opt}/v_{in}}{1 - v_{opt}/v_{out}}$$

wherein a moving speed of the optical excitation plasma is $v_{opt}$, and speeds of the incident wave and the reflected wave transmitted through the high-frequency transmission line are $v_{in}$ and $v_{out}$, respectively.

11. A frequency conversion method using an optical excitation surface plasma, wherein:

an input wave is inputted from a first side of a high-frequency transmission line which is formed on a substrate and includes a matching part to the waveguide of the output part at a second side in order to improve matching properties, a laser beam is made incident on an optical delay circuit, the laser beam is made to reach the high-frequency transmission line while a transmission time difference occurs according to a position of the high-frequency transmission line in a line direction by the optical delay circuit, the laser beam optically produces the surface plasma in the substrate through the optical delay circuit to short-circuit the high-frequency transmission line, the input wave is reflected by the surface plasma, this reflection point is moved to the second side of the high-frequency transmission line to perform frequency conversion of the input wave based on a principle of a Doppler effect, a cutoff frequency of a waveguide of an output nart is set for be larger than a maximum frequency of the input wave to total-reflect or substantially total-reflect the input wave and to allow the output wave to pass through, and a frequency-converted output wave is outputted from the out part through the matching part of the second side of the high-frequency transmission line.

\* \* \* \* \*